United States Patent
Ma et al.

(10) Patent No.: US 9,035,393 B2
(45) Date of Patent: May 19, 2015

(54) METHOD AND APPARATUS FOR FORMING AN INTEGRATED CIRCUIT WITH A METALIZED RESISTOR IN A STANDARD CELL CONFIGURATION

(71) Applicant: Taiwan Semiconductor Manufacturing Co., Ltd., Hsin-Chu (TW)

(72) Inventors: Wei Yu Ma, Taitung (TW); Bo-Ting Chen, Fengyuan (TW); Ting Yu Chen, Tainan (TW); Kuo-Ji Chen, Wu-ku (TW); Li-Chun Tien, Tainan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/779,783

(22) Filed: Feb. 28, 2013

(65) Prior Publication Data

US 2014/0210014 A1    Jul. 31, 2014

Related U.S. Application Data

(60) Provisional application No. 61/758,985, filed on Jan. 31, 2013.

(51) Int. Cl.
*H01L 27/02*    (2006.01)
*H01L 27/06*    (2006.01)
(Continued)

(52) U.S. Cl.
CPC ........ *H01L 27/0248* (2013.01); *H01L 27/0207* (2013.01); *H01L 27/0629* (2013.01); *H01L 27/11807* (2013.01); *H01L 28/24* (2013.01); *H01L 27/0288* (2013.01)

(58) Field of Classification Search
CPC ...... H01L 27/0248; H01L 23/60; H01L 28/20
USPC ............ 361/56, 212; 257/355, 360, 173, 379; 438/382
See application file for complete search history.

(56) References Cited

U.S. PATENT DOCUMENTS

| | | | |
|---|---|---|---|
| 7,749,816 B2 | 7/2010 | Correale, Jr. | |
| 2005/0224883 A1* | 10/2005 | Huang et al. | ................... 257/355 |
| 2012/0286331 A1 | 11/2012 | Aton et al. | |

OTHER PUBLICATIONS

Chen, S.H. et al., "Active ESD protection circuit design against charged-device-model ESD event in CMOS integrated circuits", Science Direct Microelectronics Reliabilty, 2007, 47:1502-1505.

(Continued)

*Primary Examiner* — Whitney T Moore
(74) *Attorney, Agent, or Firm* — Duane Morris LLP

(57) ABSTRACT

An integrated circuit includes a layer of a semiconductor device including a standard cell configuration having a fixed gate electrode pitch between gate electrode lines and a resistor formed of metal between the fixed gate electrode pitch of the standard cell configuration. In one embodiment, the integrated circuit can be charged device model (CDM) electrostatic discharge (ESD) protection circuit for a cross domain standard cell having the resistor formed of metal. A method of manufacturing integrated circuits includes forming a plurality of gate electrode lines separated by a gate electrode pitch to form a core standard cell device, applying at least a first layer of metal within the gate electrode pitch to form a portion of a resistor, and applying at least a second layer of metal to couple to the first layer of metal to form another portion of the resistor.

20 Claims, 14 Drawing Sheets

(51) Int. Cl.
*H01L 27/118* (2006.01)
*H01L 49/02* (2006.01)

(56) References Cited

OTHER PUBLICATIONS

Chun, J.H., "ESD Protection Circuit for Advanced CMOS Technologies", A Dissertation submitted to the Dept. of Electrical Engineering and the Committee on Graduate Studies of Stanford University, Jun. 2006, 137 pages.

Shiu, Y.D. et al., "CMOS Power Amplifier with ESD Protection Design Merged in Matching Network", 14th IEEE International Conference on Electronics, Circuits and Systems, ICECS 2007, pp. 825-828.

Thijs, S. et al., "CDM and HBM Analysis of ESD Protected 60 GHz Power Amplifier in 45 nm Low-Power Digital CMOS", 2009 31st EOS/ESD Symposium, 2009, 5 pages.

* cited by examiner

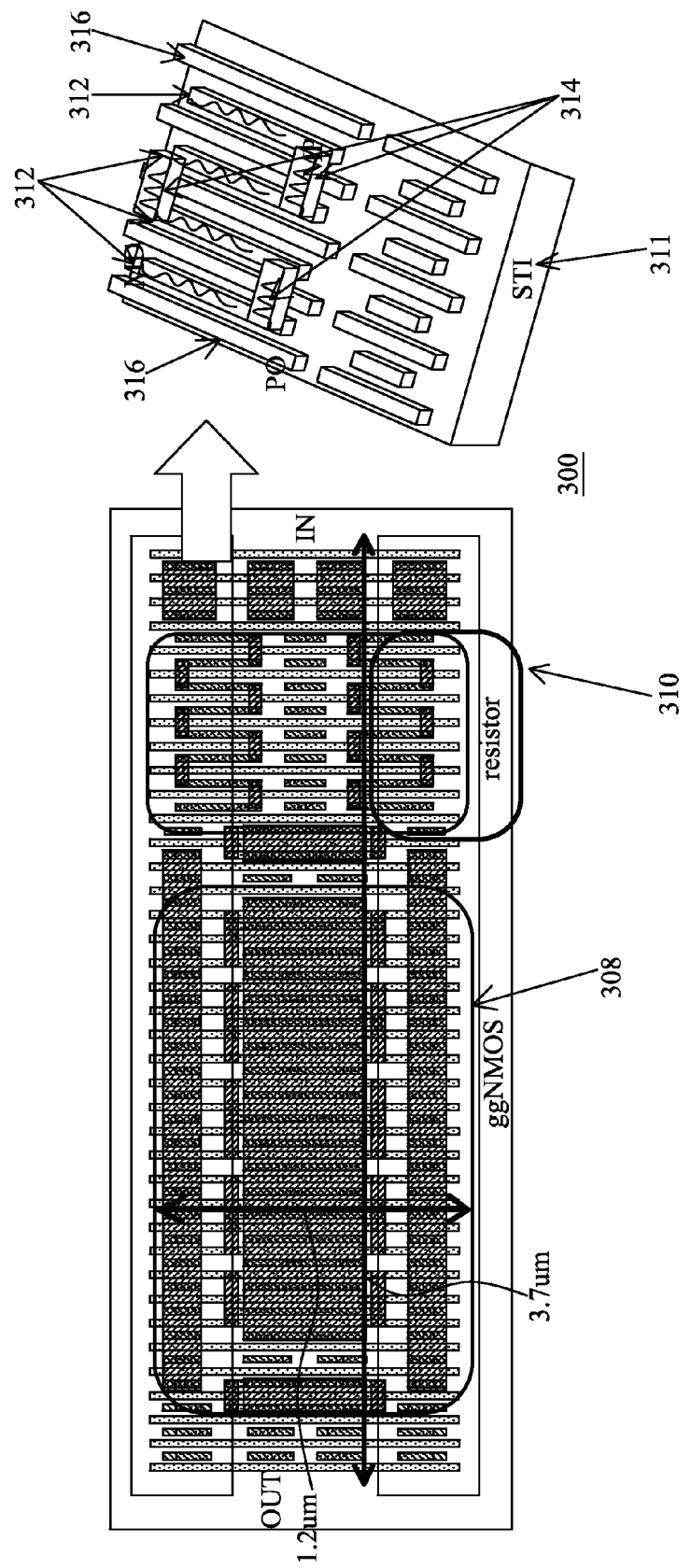
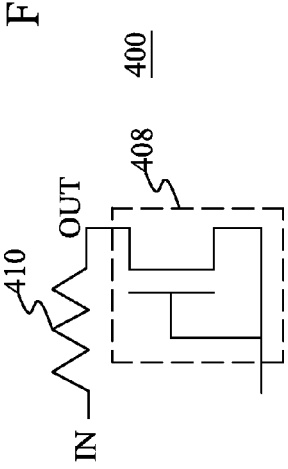
Fig. 3
Fig. 4

METHOD AND APPARATUS FOR FORMING AN INTEGRATED CIRCUIT WITH A METALIZED RESISTOR IN A STANDARD CELL CONFIGURATION

CROSS-REFERENCE TO RELATED APPLICATIONS

This application claims the benefit of U.S. Provisional Application No. 61/758,985, filed Jan. 31, 2013, which application is expressly incorporated by reference herein in its entirety.

FIELD

This disclosure relates, most generally, to semiconductor devices and manufacturing and more specifically to integrated circuits and methods for forming an integrated circuit having a metallized resistor in a standard cell configuration.

BACKGROUND

In the semiconductor manufacturing industry, fabrication of integrated circuits on a semiconductor wafer involves a number of steps in which patterns are formed in a film of photosensitive resist, i.e. a photoresist, formed on the wafer. With the patterned formed, and void areas within the photoresist film, subsequent processing operations such as implantation of impurities, oxidation, etching and metallization may be performed. Once an integrated circuit is completely formed on a semiconductor wafer, the wafer is next assembled into a package.

In a CMOS process, transistors are typically formed by providing an active area with doped source/drain regions in the substrate, a gate insulating layer over the substrate, and a gate electrode over the gate insulating layer. Contacts (e.g., tungsten) connect the source/drain regions and gate electrode with a conductive interconnect structure having several horizontal conductive pattern layers (typically referred to as M1, M2, etc.) and vertical via layers formed within a plurality of inter-metal dielectric layers.

The standard cell configuration for an integrated circuit can be defined in a library having a rectangular pattern where the polysilicon pitch between adjacent polysilicon conductors has fixed width and/or height. A bounding box (BB) of a logic cell is the smallest rectangle that encloses all of the geometry of the cell. The cell BB is normally determined by the well layers. Cell connectors or terminals (the logical connectors) are placed on the cell abutment box (AB). The physical connector (the piece of metal to which wires are connected) normally overlaps the abutment box slightly to assure connection without leaving a tiny space between the ends of two wires. The standard cells are constructed so they can all be placed next to each other horizontally with the cell ABs touching (two cells abut).

A standard cell (a D flip-flop with clear, for example) can have some common features in a standard-cell layout. Some of those features can include connectors that are at the top and bottom of the cell on m2 on a routing grid equal to the vertical (m2) track spacing. This is a double-entry cell intended for a two-level metal process. A standard cell designed for a three-level metal process has connectors in the center of the cell. Transistor sizes can vary to optimize the area and performance but they are configured to maintain a fixed ratio to balance rise times and fall times. The cell height defined in a library are the same height with a predefined horizontal (m1) track spacing. This is close to the minimum height that can accommodate the most complex cells in a library. Power rails can be placed at the top and bottom, maintaining a certain width inside the cell and abut with the power rails in adjacent cells. The well contacts (substrate connections) are placed inside the cell at regular intervals. Additional well contacts may be placed in spacers between cells. Most commercial standard cells use m1 for the power rails, m1 for internal connections, and avoid using m2 where possible except for cell connectors.

When a library developer creates a gate-array, standard-cell, or datapath library, there is a trade-off between using wide, high-drive transistors that result in large cells with high-speed performance and using smaller transistors that result in smaller cells that consume less power. A performance-optimized library with large cells might be used for ASICs in a high-performance workstation, for example. An area-optimized library might be used in an ASIC for a battery-powered portable computer.

BRIEF DESCRIPTION OF THE DRAWING

The present embodiments are best understood from the following detailed description when read in conjunction with the accompanying drawing. It is emphasized that, according to common practice, the various features of the drawing are not necessarily to scale. On the contrary, the dimensions of the various features are arbitrarily expanded or reduced for clarity. This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise. Like numerals denote like features throughout the specification and drawing.

FIG. 3 is a standard cell layout having a formed resistor in accordance with the embodiments;

FIG. 4 is a circuit equivalent of FIG. 3;

DETAILED DESCRIPTION

One aspect of the present disclosure provides an integrated circuit including a standard cell configuration having a fixed polysilicon pitch and a resistor formed of metal within the fixed gate electrode pitch between adjacent gate electrode lines of the standard cell configuration. The integrated circuit can be a charged device model (CDM) electrostatic discharge (ESD) protection circuit in a cross power domain. The CDM ESD protection circuit can include the resistor and a gate grounded NMOS (ggNMOS) circuit. The CDM ESD protection circuit can be arranged and constructed with adjacent standard cells abutting each other or arranged and constructed without a keep out zone between adjacent cells of the standard cell configuration. Another aspect of the present disclosure includes various methods of manufacturing the integrated circuit discussed above. Although the illustrations in FIGS. 3-4 and 6-14 illustrate various embodiments, it should be understood that this is exemplary only.

Figure 1:
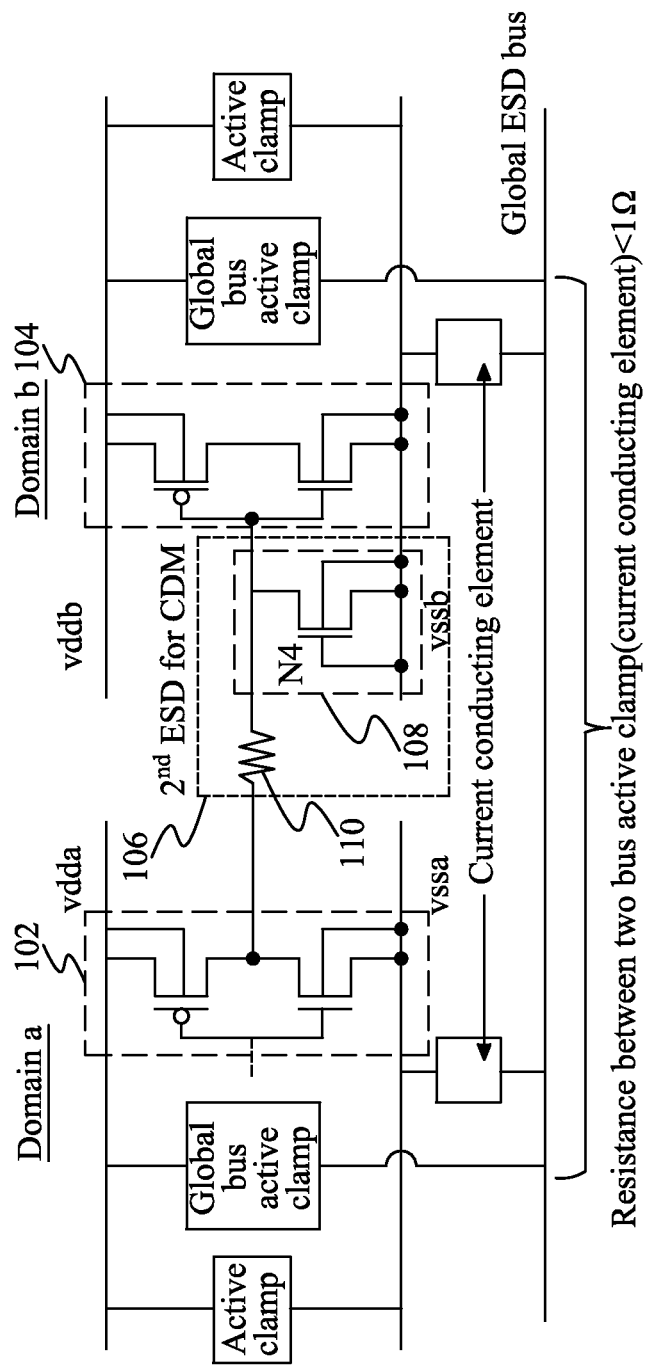
FIG. 1 is a circuit diagram showing an electrostatic dissipation device used between different power domains of an overall integrated circuit.

FIG. 1 illustrates a CDM ESD protection circuit 106 in the cross power domain in accordance with various embodiments of the present disclosure, where a first inverter 102 operates with a first power supply level in a first Domain "a" and a second inverter 104 operates with a second power supply level in a second domain "b" for an overall circuit cell 100. The CDM ESD protection circuit 106 is used to protect the receiving circuit (104) by providing a local discharge path.

Figure 2:
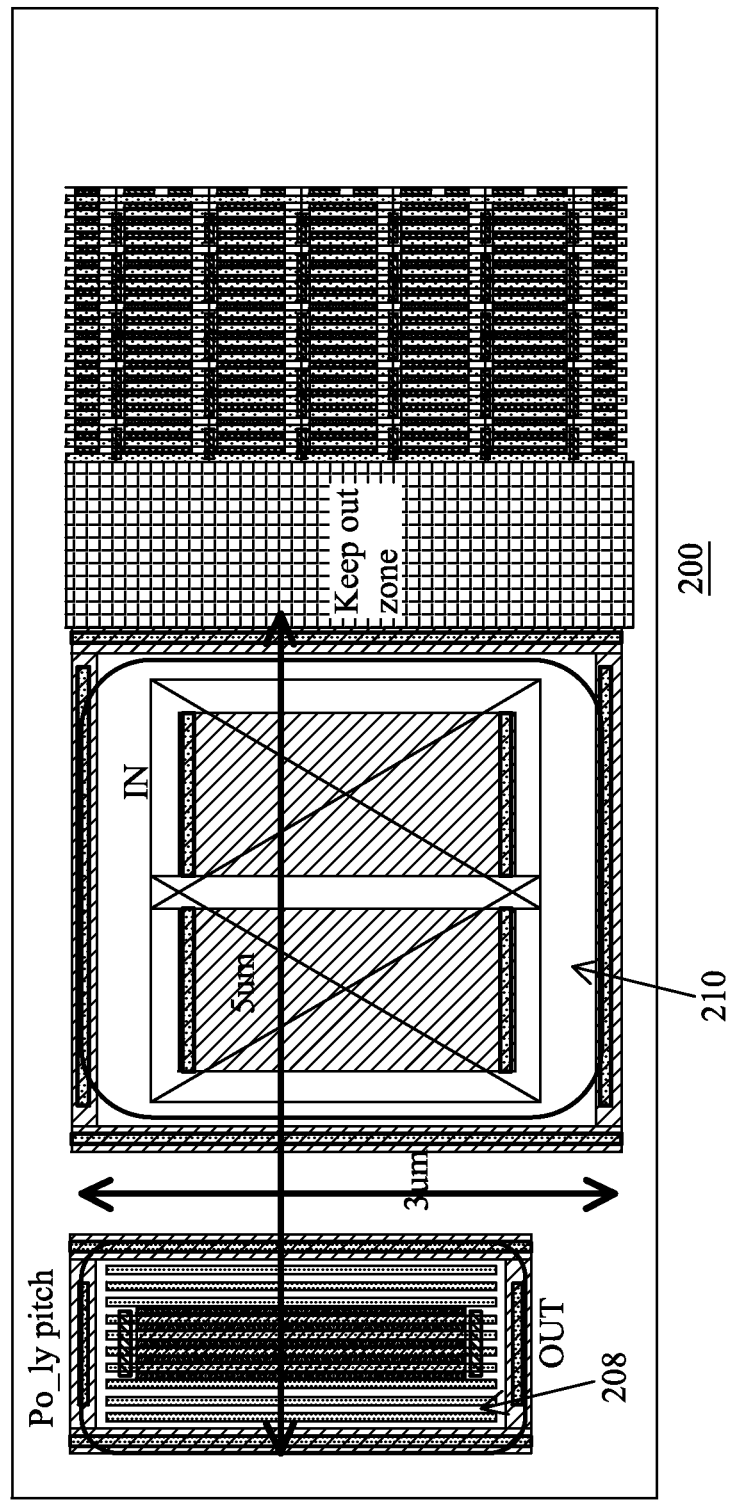
FIG. 2 is a top plan view of a conventional charged device model cell protection circuit.

Referring to FIG. 2, a CDM cell implementation 200 is shown having a 200 Ohm resistor 210 and a ggNMOS circuit 208. The titanium nitride (TiN) resistor (or OD resistor) used in such a design typically involves an extra mask having a greater outside dimension and the ggNMOS circuit layout following an ESD guideline for maximum snapback efficiency has an outside dimension width greater than 2 um. The layout does not fit a standard cell implementation since the layout does not comply with certain isolation rules and the metal track would not fit a standard cell. The CDM cell gate electrode or polysilicon pitch yields a cell layout dimension of about 3 um×5 um as shown. Furthermore, there is a "keep-out" zone as shown between the standard cell and the CDM cell. The "keep-out" zone is not made available for circuitry, and reduces the space utilization of the layout.

Referring to FIG. 3, a standard cell layout 300 has a metal resistor 310 and a ggNMOS circuit 308 formed therein. The ggNMOS circuit layout follows the standard cell double height form factor. The resistor 310 is formed with a first metal layer (M0) 312 and further formed with a second metal layer (MP) 314 connected to the first metal layer 312. The first metal layer 312 of the resistor can be formed within the pitch between adjacent lines of a gate electrode layer 316 which is frequently made of polysilicon. Note, however, the embodiments herein are not limited to a particular material for the gate electrode. For example, gate electrodes are formed over an insulating layer provided above an active region of a substrate. In some embodiments, the insulating layer of the ggNMOS circuit 308 can be the same layer used for forming the gate insulating layer of transistors on the same substrate. In some embodiments, the insulating layer can comprise a high-K dielectric, such as, but not limited to, a hafnium based oxide, a hafnium based oxynitride, or a hafnium-silicon oxynitride, hafnium silicate, zirconium silicate, hafnium dioxide and zirconium dioxide. The high-k dielectric layer may include a binary or ternary high-k film such as HfO, LaO, AlO, ZrO, TiO, $Ta_2O_5$, $Y_2O_3$, STO, BTO, BaZrO, HfZrO, HfLaO, HfTaO, HfTiO, or combinations thereof, or other suitable materials. Alternatively, the high-k dielectric layer may optionally include a silicate such as HfSiO, LaSiO, AlSiO, or combinations thereof. The insulating layer may be deposited using atomic layer deposition. In other embodiments, which do not use a high-k metal gate process, the structure and technique described herein may be used in a process employing a silicon oxide gate insulating layer such as polysilicon as noted above. Note, that although the term "gate electrode layer" may be used herein interchangeably with "polysilicon" or "polysilicon layer", the latter terms are only used as an example of the type of material that can be used in some of many embodiments.

Figure 5:
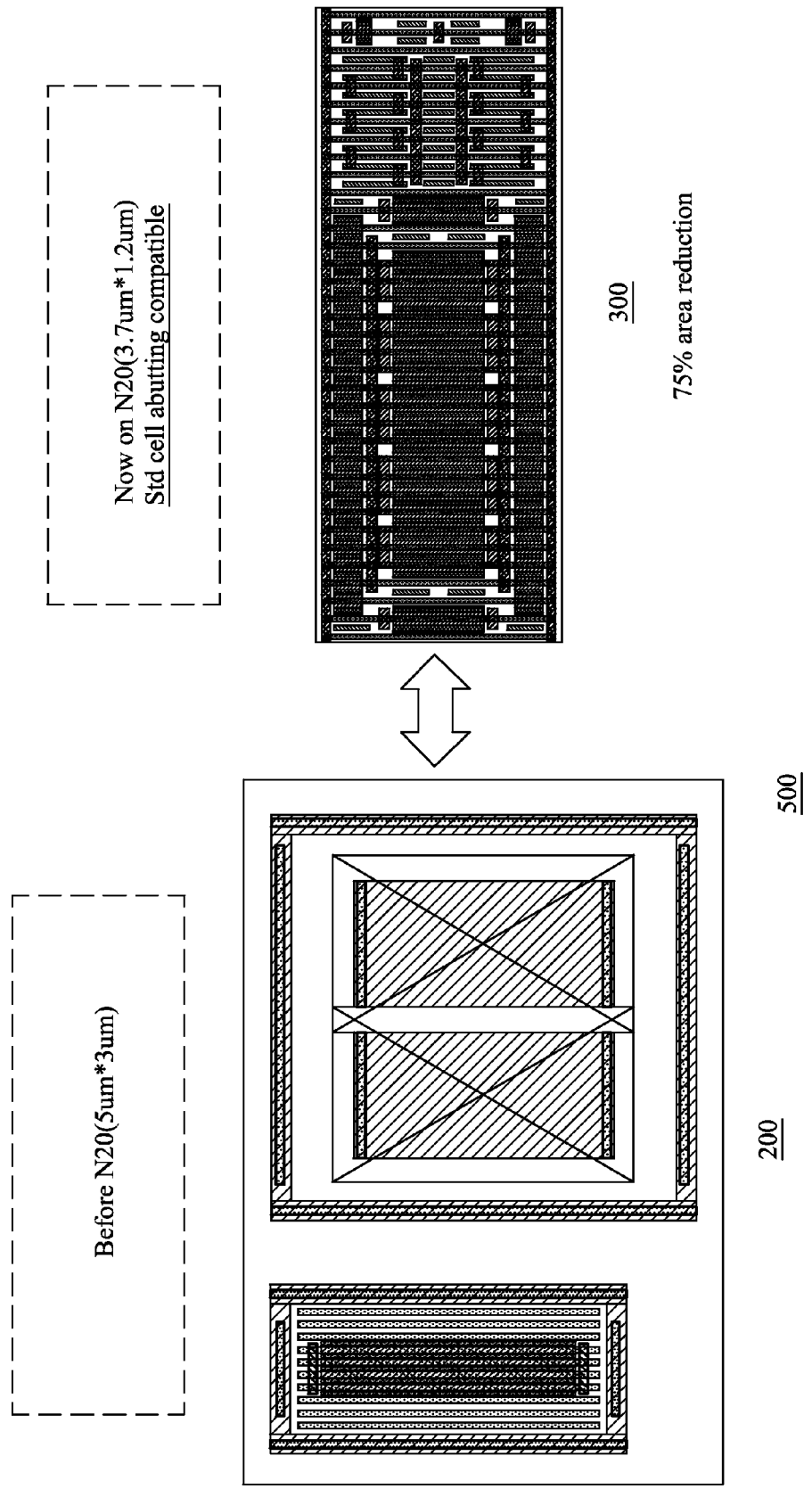
FIG. 5 compares the sizes of the existing circuit layout with the standard cell layout having the formed resistor in accordance with the embodiments.

This layout (for a 200 Ohm resistor and the ggNMOS circuit) can now be formed on about a 3.7 um×1.2 um cell layout having the standard fixed polysilicon pitch spacing and the typical shallow trench isolation structures 311. A 100 Ohm resistor implementation can be formed on about a 3.3 um×1.2 um cell layout and a 50 Ohm resistor implementation can be formed on about a 3.1 um×1.2 um layout. Furthermore, the footprint of this cell arrangement allows this layout to be standard-cell-abutting compatible. In other words, the formation of the resistor(s) between the adjacent gate electrode lines or polysilicon lines enables the CDM ESD cell to be sufficiently small enough to avoid using a "keep-out" zone between standards cells incorporating the CDM ESD cell configuration herein. FIG. 4 illustrates a circuit equivalent 400 of the CDM ESD cell layout 300 having a resistor 310 and a ggNMOS 408 circuit. FIG. 5 illustrates a size comparison between the configuration 200 that is not standard cell abutting compatible and the standard cell configuration 300 that is standard cell compatible. Further note that the standard cell configuration 300 represents a 75% reduction in area over the configuration 200.

Figure 6:
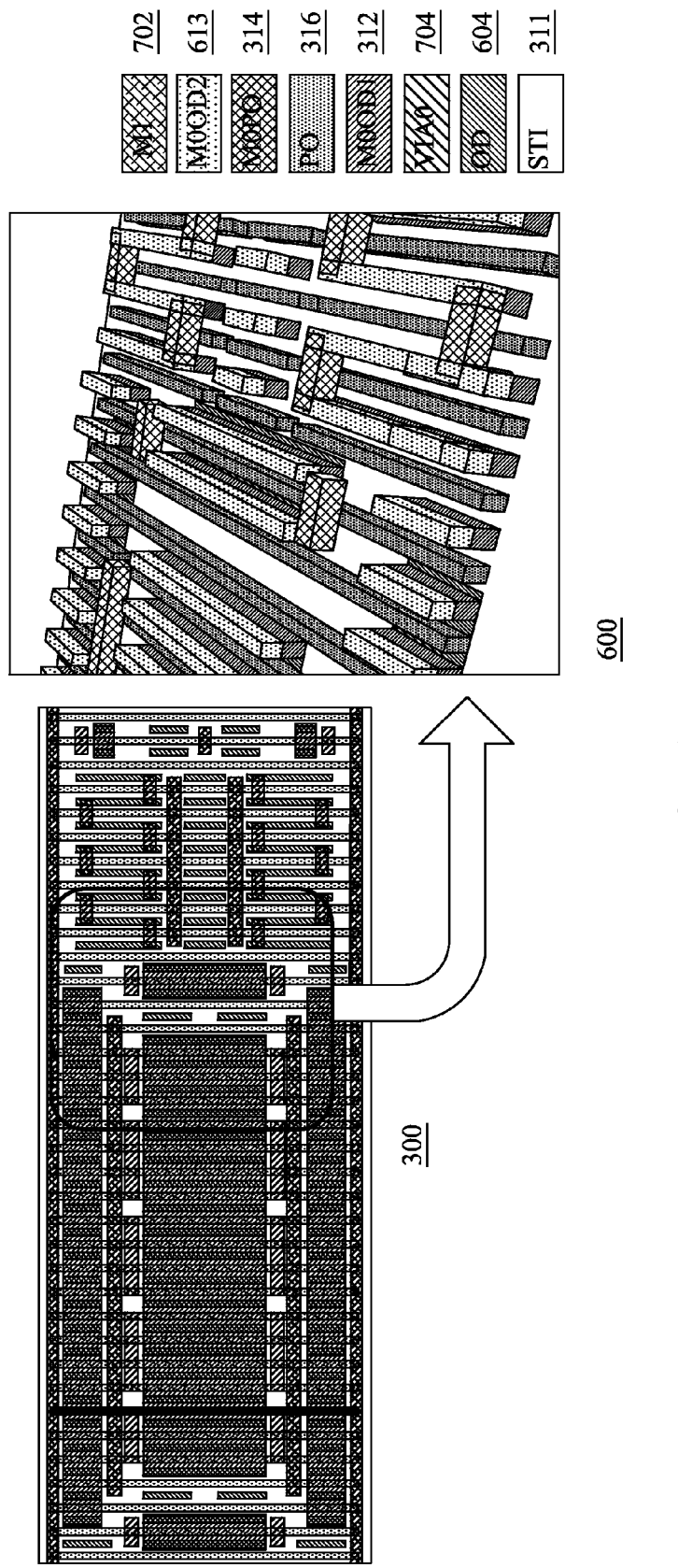
FIG. 6 illustrates a 3 dimensional view of a portion of the standard cell layout having the formed resistor in accordance with the embodiments.
Figure 7:
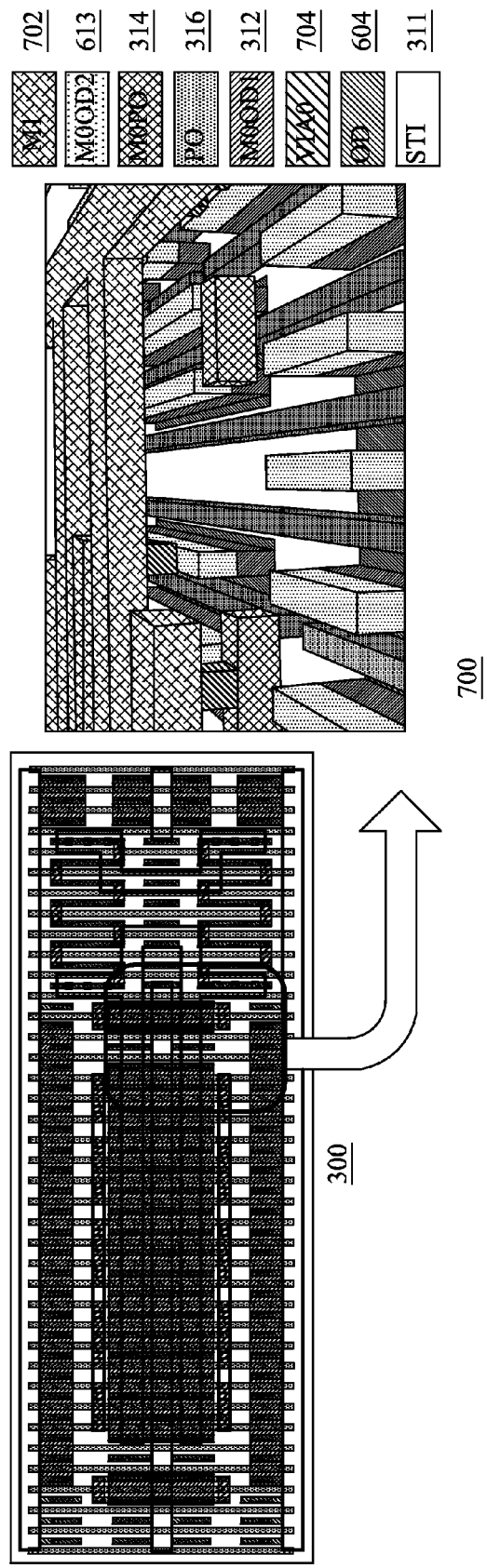
FIG. 7 illustrates a 3-dimensional view of a cross section of the standard cell layout having the formed resistor in accordance with the embodiments.
Figure 8:
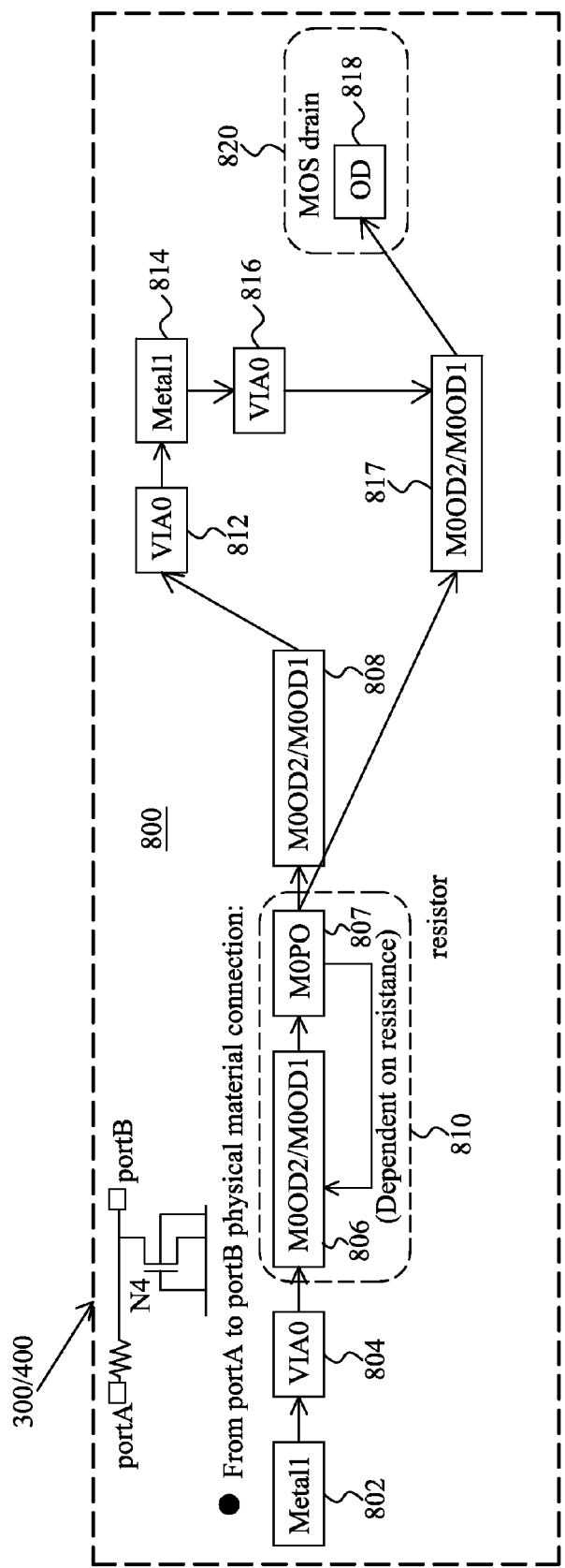
FIG. 8 illustrates a process flow of connecting an input port of the ESD cell with an output of the ESD cell in accordance with the embodiments.

Referring to FIG. 6, a 3-dimensional representation 600 of a portion of the CDM ESD standard cell layout 300 more clearly shows the various layers used in forming the resistor within the polysilicon pitch between adjacent polysilicon lines (the poly to poly space). FIGS. 7 and 8 further depict interconnections of the various portions of the CDM ESD cell layout 300. As noted above and further depicted in FIG. 6, the resistor can be formed of at least a first metal layer (M0OD1) 312 which can include another metal layer (M0OD2) 613. The metal layers 312 and 613 would be formed between the adjacent polysilicon lines of the polysilicon layer (PO) 316. At least yet another metal layer (M0PO) 314 can be used as part of the resistor to interconnect the metal layers (312 and/or 613) between the polysilicon lines as illustrated. Portions forming the drain of a transistor can include an oxide layer 604. The gray portion represents the shallow trench isolation structure 311. FIG. 7 further illustrates another 3-dimensional representation 700 where another metal layer (M1) 702 is primarily used as an interconnect between components of the CDM ESD cell layout 300. The metal layer 702 uses vias 704 to connect the resistor to the MOS drain of the ggNMOS circuit and further uses metal layer 702 and vias 704 to form ports (Ports A and B of FIG. 8) to connect between cells containing similar circuits or other circuits.

Referring to FIG. 8, a process 800 of forming the physical material connections from Port A and Port B of the CDM ESD standard cell layout 300 or circuit 400 is shown. As illustrated, the metal layer 702 (M1) forming Port A connects to the resistor 810 through the via 804. The resistor 810 can be formed using a combination of metal layers. Depending on the desired level of resistance, combinations of metallization using metal layers 613 and 312 (M0OD2/M0OD1) is used at step 806 with further iterative combinations using metal layer 314 (M0PO) at step 807. After the final layer at 807 is placed, another layer of metallization (of 613 or 312 or both) is applied at 808. The resistor 810 is connected to a layer 818 of a MOS drain 820 (of the ggNMOS circuit) using metallization 702 (M1) through formed vias formed at 812, 816 and 817 to connect the resistor to the ggNMOS circuit. Another connection from resistor 810 to layer 818 of MOS drain 820 is to use 817 to connect the resistor to the ggNMOS circuit.

Figure 9:
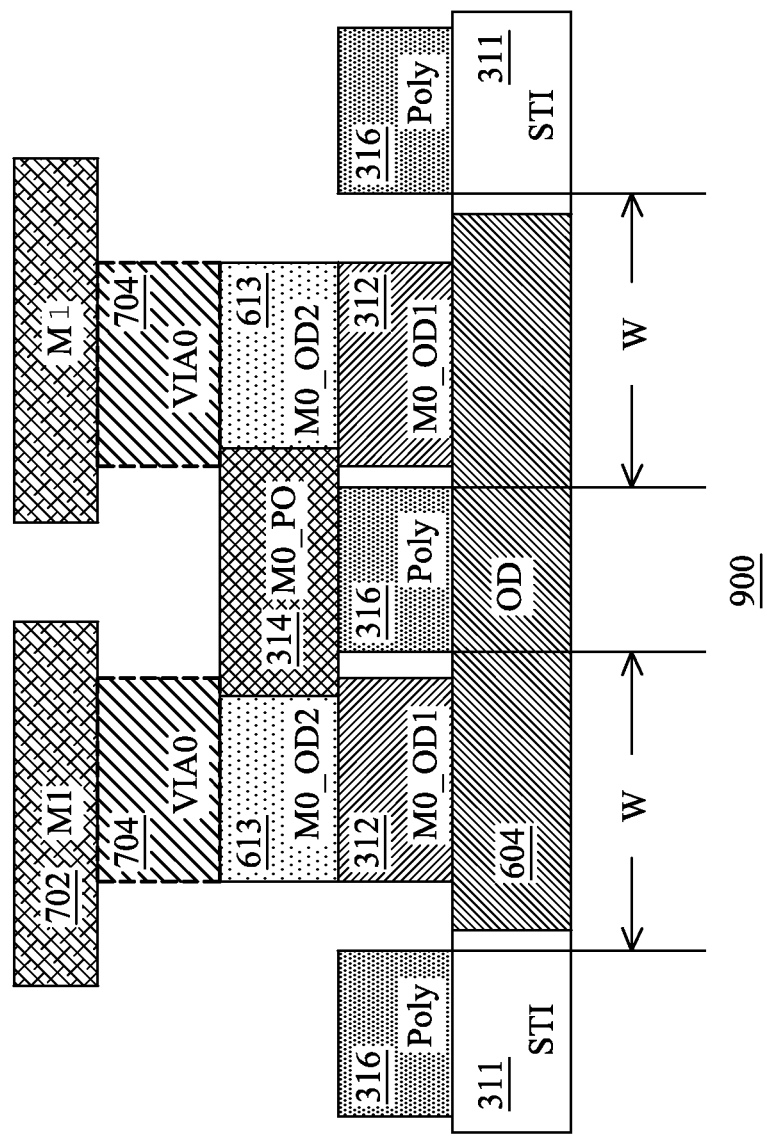
FIG. 9 illustrates a cross section view of a portion of FIG. 7

FIG. 9 depicts a cross-sectional view of a portion of the CDM ESD cell layout 300 of FIG. 7. As noted above, metal layer (M1) 702 is primarily used as an interconnect between components of the CDM ESD cell layout 300, but this cross sectional view is intended to focus on the resistor formed of metal layers 312, 613, and 314 within the fixed polysilicon pitch (denoted here as "w") between adjacent polysilicon lines 316 of the standard cell configuration. The resistor formed of metal efficiently uses the available area within the constraints of the standard cell configuration between the adjacent polysilicon lines 316, but also between the substrate (STI 311/oxide definition layer 604) and the M1 metal layer 702. The metal layer 702 further uses vias 704 to connect the resistor to the MOS drain of the ggNMOS circuit and further uses metal layer 702 and vias 704 to form ports.

As shown in FIG. 9, contact portions M0_OD1 312 are formed in the same layer as the gate electrode 316. The contact portion M0_OD1 312 directly contacts the substrate 604. The contact portion M0_OD1 312 may be a sputtered or evaporated metal pad patterned using photolithography, to provide low-resistance, and stability for the performance and reliability. For a silicon substrate, examples of suitable contact materials for contact portion 121 include W, Al, Al—Si, TiSi$_2$, TiN, MoSi$_2$, PtSi, CoSi$_2$, WSi$_2$.

In some embodiments, second contact portions 613 M0_OD2 are formed on the contact portions 312 M0_OD1. In some embodiments, the second contact portions 613 in the M0_OD2 layer are made of the same material as the first contact portions in the M0_OD1 layer. In some embodiments, the second contact portions 613 in the M0_OD2 layer are made of copper using a damascene process. In other embodiments, both contact portions 312 and 613 are formed in a single step of a material such as W, Al, Al—Si, TiSi$_2$, TiN, MoSi$_2$, PtSi, CoSi$_2$, WSi$_2$.

A resistor layer 314 (M0-PO) is provided having a first portion directly on the gate electrode 316. The resistor 314 is in the M0 PO layer at the contact level, abutting the gate electrode 316. The resistor layer 314 is also in the same layer as the top portion 613 of the contacts M0_OD2, and abuts the contacts 613.

The VIA0 layer is formed over the contact layers 613 (M0_OD2) and 314 (M0_PO). The VIA0 plugs 704 can be a compound including, as a major component, tungsten or copper.

Thus, as shown in FIGS. 6, 7 and 9, the resistors for the ggNMOS of the ESD protection device are formed within the front end of line (FEOL) layers. In some embodiments, the resistors are formed in the M0_OD1, M0_OD2 and M0_PO contact layers, either in direct contact with the substrate 604, or in a contact layer immediately over the gate electrode (poly) layer. This permits a very compact configuration, because the resistor does not have to be formed in any of the metal layers M1, M2, M3, or the like.

Figure 10:
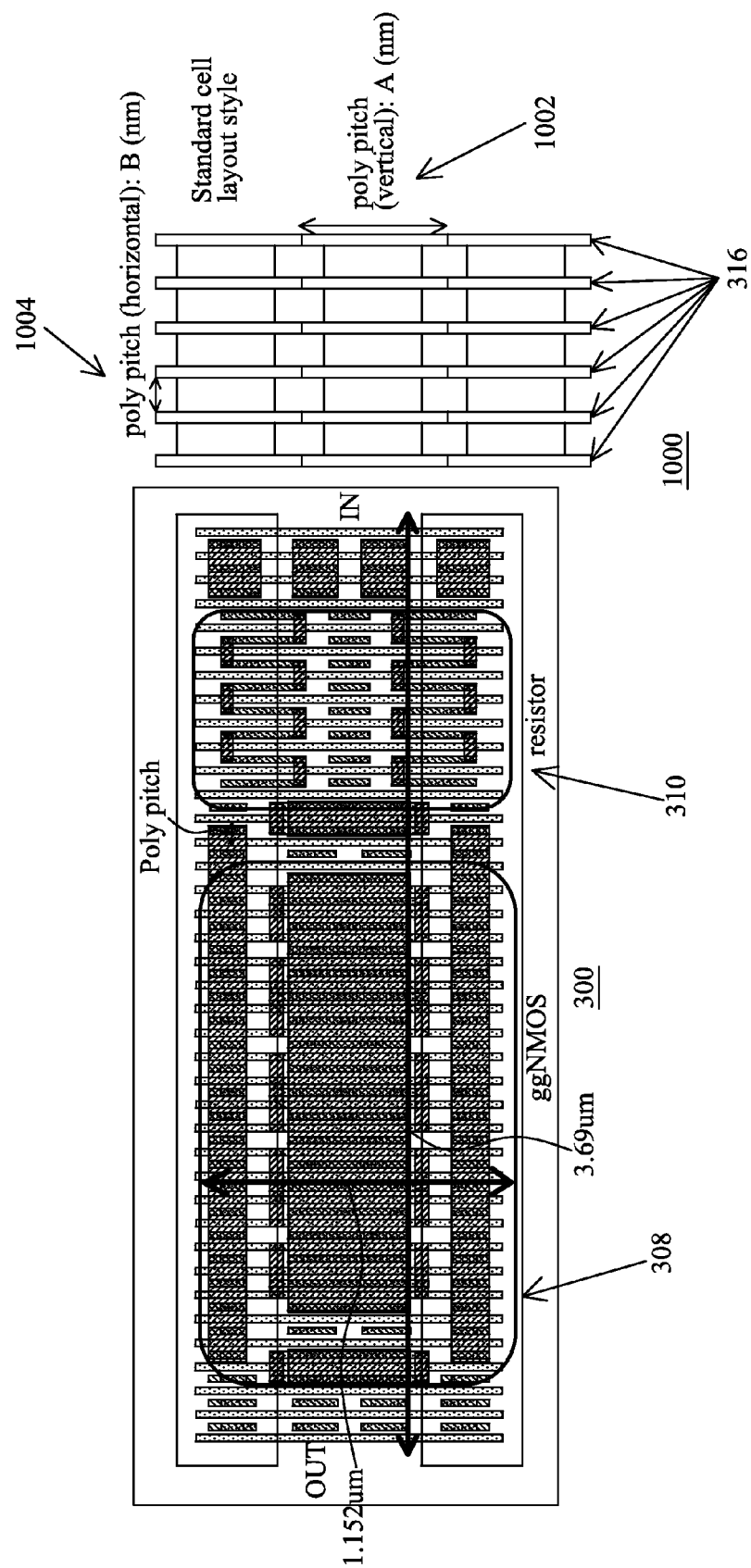
FIG. 10 illustrates the fixed vertical and horizontal polysilicon pitches of the standard cell having the formed resistor in accordance with the embodiments.

Referring to FIG. 10, the polysilicon pitch representation 1000 illustrates a vertical polysilicon pitch 1002 and a horizontal polysilicon pitch of the various portions of polysilicon 316 formed on the CDM ESD standard cell layout. The pitch between lines in the polysilicon (or gate electrode) layer is fixed to a certain distance in the vertical direction and to a certain distance in the horizontal direction. As explained above, the resistor formed of metal (such as an alloy of tungsten) enables a resistor configuration that can be formed and implemented within the standard cell polysilicon pitch. Furthermore, the CDM ESD standard cell layout can be implemented without a keep out zone between standard cells. A keep out zone would create a larger and unnecessary footprint for the circuit layout.

Figure 11:
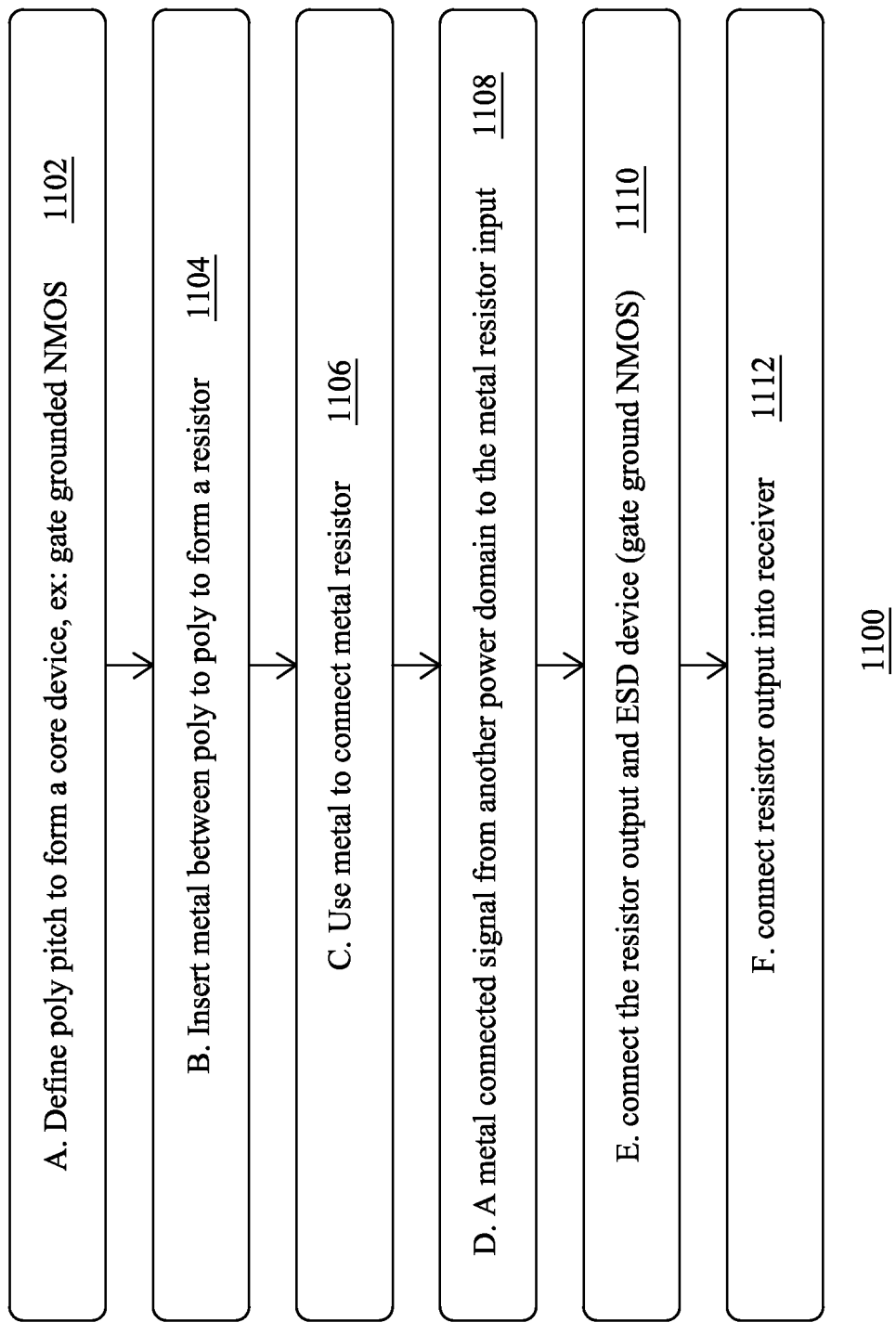
FIG. 11 is a flow chart illustrating a method of manufacturing an integrated circuit in accordance with the present disclosure.

Referring to FIG. 11, a method 1100 of manufacturing integrated circuits such as the circuits implemented using the CDM ESD standard cell layout 300 is shown. The method can include defining a polysilicon pitch to form a core standard cell device (such as a ggNMOS device) at 1102, applying at least a first layer of metal between the adjacent polysilicon lines to form a portion of a resistor at 1104, and applying at least a second layer of metal to couple to the first layer of metal to form another portion of the resistor at 1106. The method 1100 can further include applying metal to connect a circuit from a first power domain to an input of the resistor at 1108, applying metal to connect an output of the resistor to the gate grounded NMOS device at 1110, and applying metal to connect the output of the resistor to a (receiver) circuit from a second power domain at 1112. Note, the core standard cell device and the resistor form a CDM ESD protection circuit in a cross power domain. With further reference to FIG. 8, the method 1100 can further include applying at least a third layer (M1) of metal through at least first, second, and third vias (804, 812, and 816) in a multilayered substrate to form a connection between an input port of the CDM ESD protection circuit and an output port of the CDM ESD protection circuit. If the core standard cell device comprises a gate grounded NMOS device, the method can further comprise a connection of the third layer of metal (M1) through the third via (816) to an oxide layer 818 to form a MOS drain 820 of the gate grounded NMOS device 308. As explained above, the CDM ESD protection circuit can be arranged and constructed to enable adjacent standard cells to abut each other without a keep out zone between adjacent cells of the core standard cell device.

Figure 12:
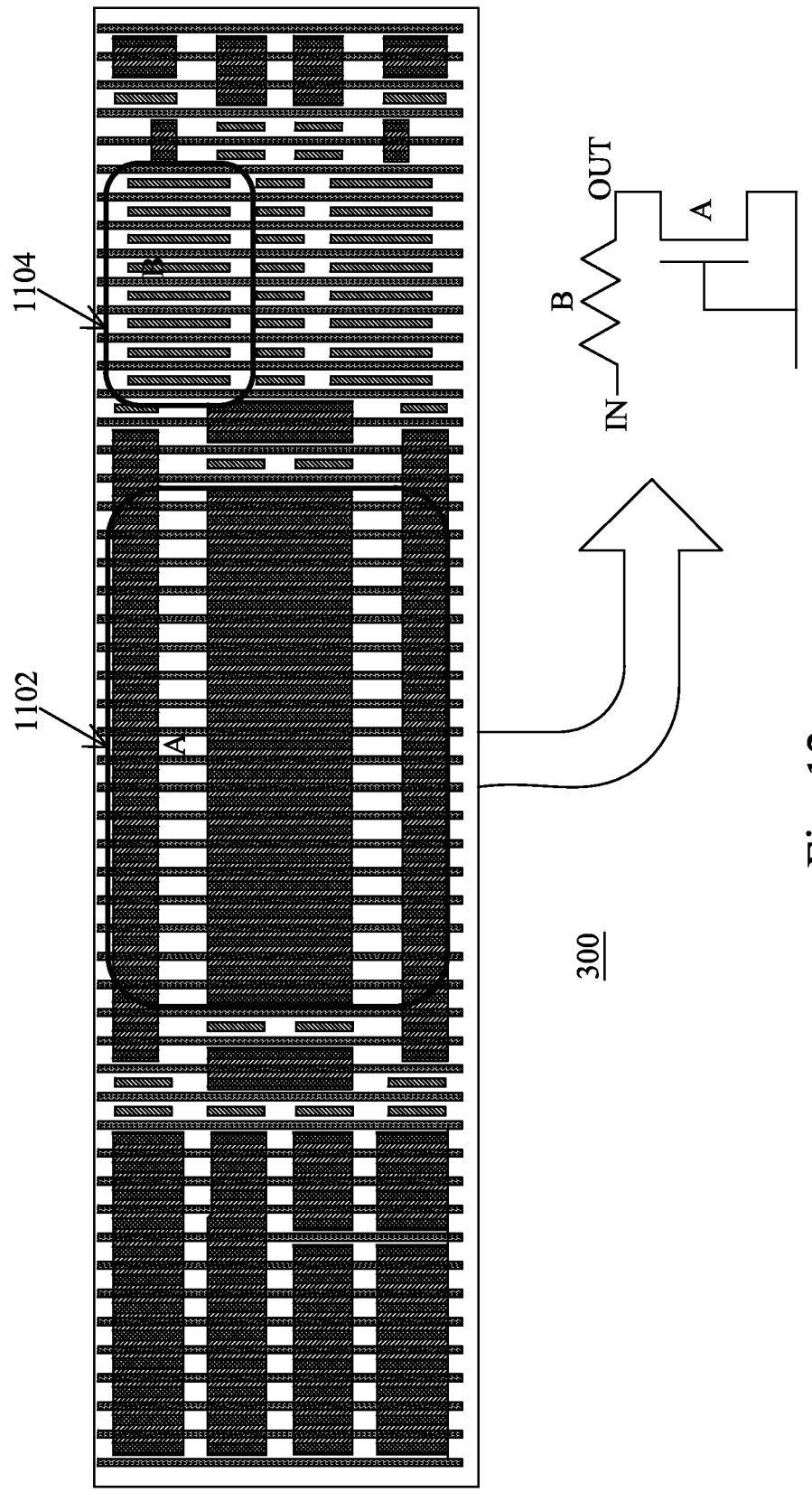
FIG. 12 illustrates the first two steps of the flow chart of FIG. 11.
Figure 13:
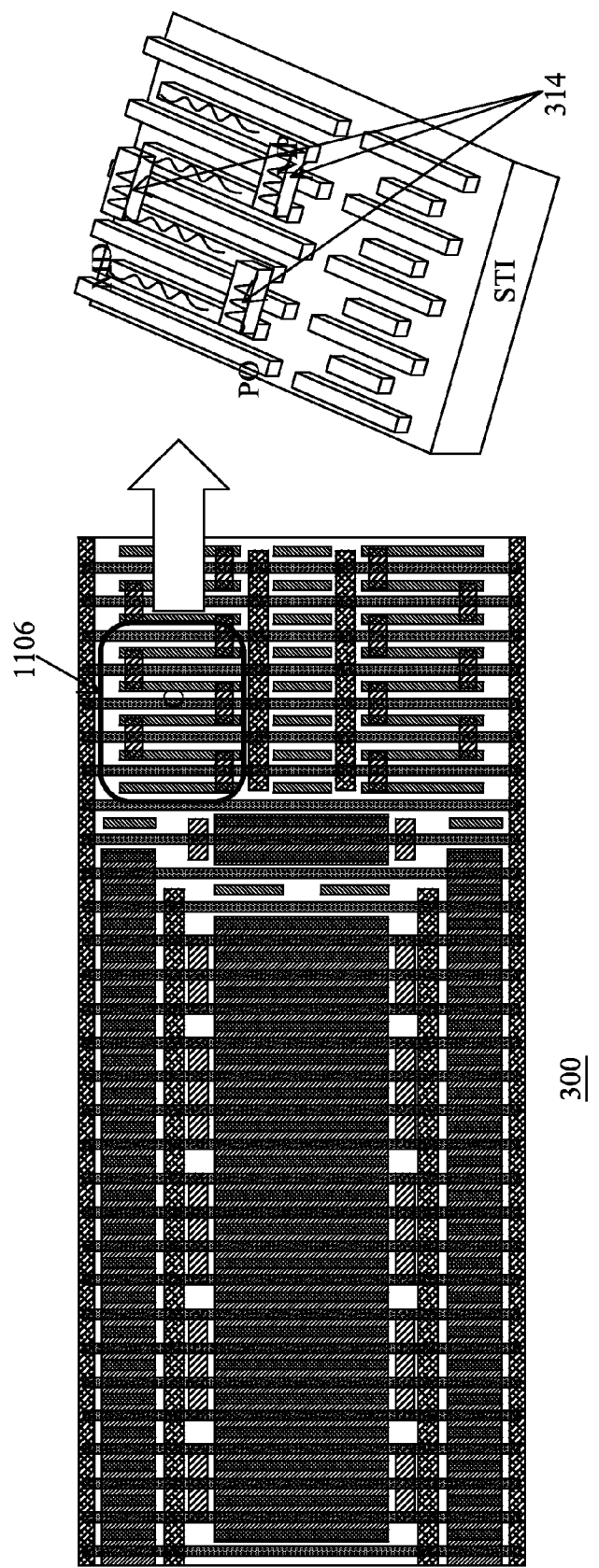
FIG. 13 illustrates the third step of the flow chart of FIG. 11.
Figure 14:
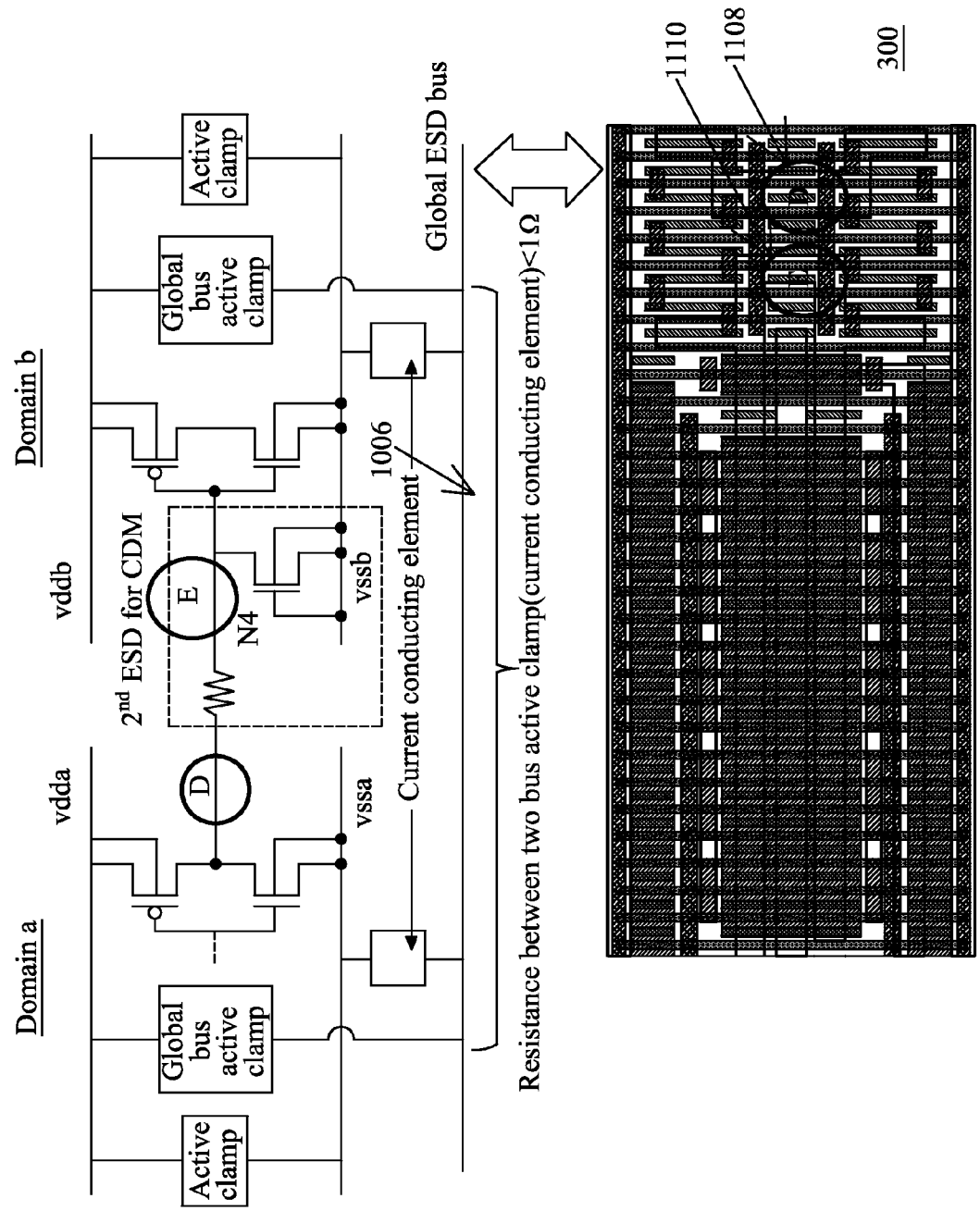
FIG. 14 illustrates the fourth and fifth steps of the flow chart of FIG. 11.

FIGS. 12-14 provide further detail of the various steps in the method 1100 of FIG. 11. In FIG. 12, the area A/1102 of the CDM ESD protection circuit layout 300 represents the step of 1102 of defining the polysilicon poly (316) pitch to form a core device, such as the ggNMOS device. The area B/1104 represents the step 1104 of applying or inserting metal (312/613) between the polysilicon lines (or "poly to poly" space) to form a resistor or a portion of a resistor. The metal applied during step 1104 may also be referred to the MD metal layer. Referring to FIG. 13, the area C/1106 of the CDM ESD protection circuit layout 300 represents the step of 1106 of using metal (314) to connect to portions of the metal resistor formed in the prior step 1104. The metal applied during step 1106 may also be referred to the MP metal layer.

Figure 15:
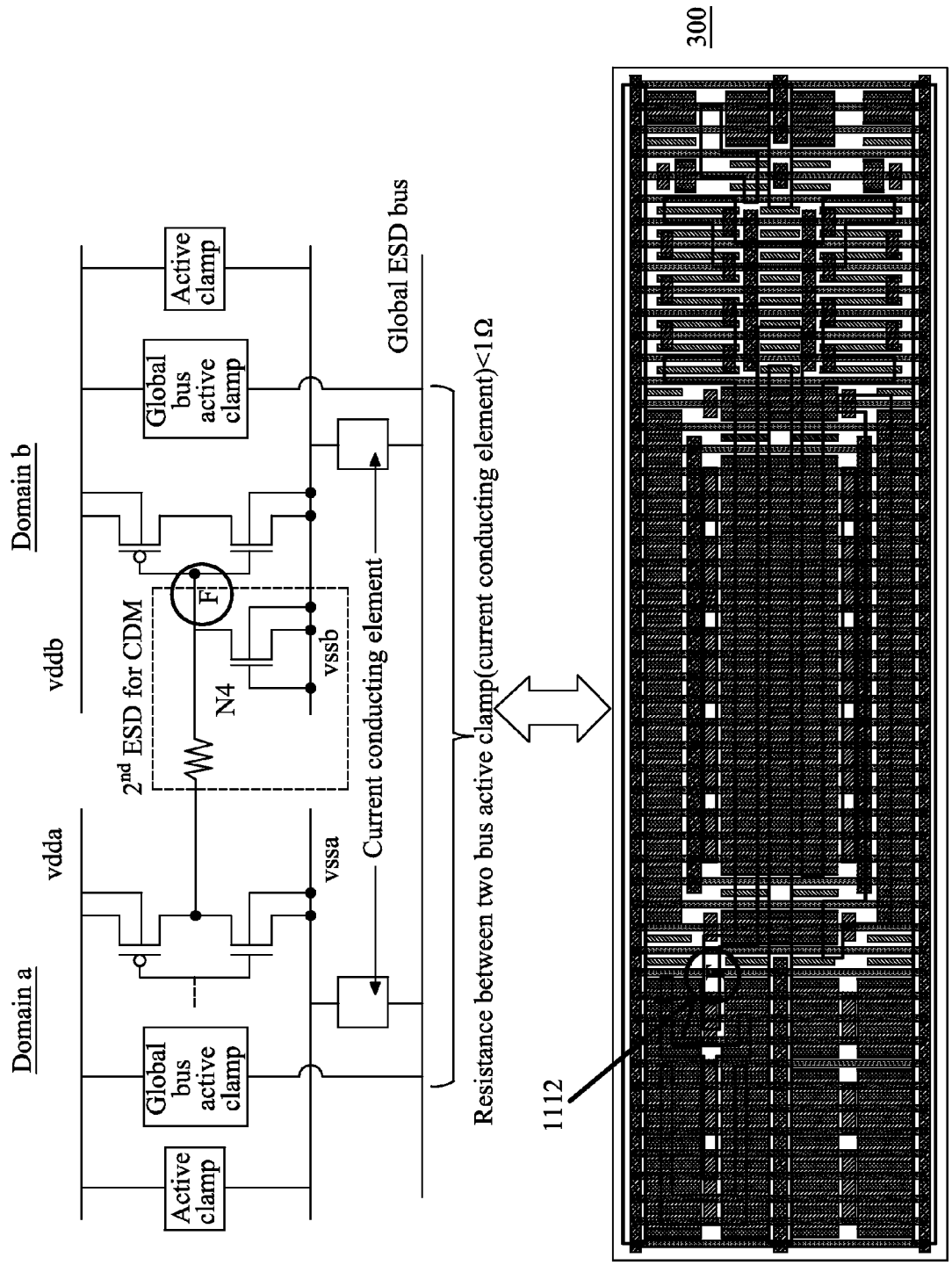
FIG. 15 illustrates the sixth step of the flow chart of FIG. 11.

Referring to FIG. 14, the area D/1108 of the CDM ESD protection circuit layout 300 represents the step of 1108 where a metal layer connects a signal from another power domain to the metal resistor input The area E/1110 represents the step 1110 where a connection is made between the resistor output and ESD device (gate ground NMOS). Finally, referring to FIG. 15, the area F/1112 of the CDM ESD protection circuit layout 300 represents the step of 1112 where the resistor output is connected to the circuit receiving the output from the resistor. In this particular instance, it is the gate input to the inverter circuit in Domain b as shown.

The present disclosure provides an integrated circuit including a standard cell configuration having a fixed polysilicon pitch and a resistor formed of metal between the fixed lines of a gate electrode layer of the standard cell or in one particular embodiment polysilicon lines of the standard cell configuration. The integrated circuit can be a charged device model (CDM) electrostatic discharge (ESD) protection circuit in a cross power domain. The CDM ESD protection circuit can include the resistor and a gate grounded NMOS (ggNMOS) circuit. The CDM ESD protection circuit can be arranged and constructed without a keep out zone between adjacent cells of the standard cell configuration. The CDM ESD protection circuit can be coupled between a first inverter circuit of a first domain and a second inverter of a second domain. In various embodiments, the resistor can have a value of 50, 100 or 200 Ohms. Note that the metal used for the resistor can be an electrostatic dissipating resistor primarily made from tungsten.

In another aspect, the present disclosure provides a method of manufacturing integrated circuits by defining a polysilicon pitch to form a core standard cell device (which can be a gate grounded NMOS device, for example), applying at least a first layer of metal within the space between the gate electrode layer lines to form a portion of a resistor, and applying at least a second layer of metal to couple to the first layer of metal to form another portion of the resistor. The core standard cell device and the resistor can form a charged device model (CDM) electrostatic discharge (ESD) protection circuit in a cross power domain. The method can further include applying metal to connect a circuit from a first power domain to an input of the resistor. The method can further include applying metal to connect an output of the resistor to the gate grounded NMOS device and applying metal to connect the output of the resistor to a circuit from a second power domain. The method can further include applying at least a third layer of metal through at least first, second, and third vias in a multilayered substrate to form a connection between an input port of the CDM ESD protection circuit and an output port of the CDM ESD protection circuit. The method can also include a connection of the third layer of metal through the third via to an oxide layer to form a MOS drain of the gate grounded NMOS device.

In another aspect, the present embodiments provides a charged device model (CDM) electrostatic discharge (ESD) protection circuit for a cross domain standard cell including a gate grounded NMOS device and a resistor coupled to the gate grounded NMOS device, the resistor formed of one or more layers of metal within a fixed space between gate electrode layer lines of a standard cell configuration containing the gate ground NMOS device and the resistor. The CDM ESD protection circuit can be arranged and constructed to have adjacent standard cells abutting each other without a keep out zone between adjacent cells of the standard cell configuration.

The preceding merely illustrates the principles of certain examples. It will thus be appreciated that those skilled in the art will be able to devise various arrangements which, although not explicitly described or shown herein, embody the principles and are included within their spirit and scope. Furthermore, all examples and conditional language recited herein are principally intended expressly to be only for pedagogical purposes and to aid the reader in understanding the principles and the concepts contributed by the inventors to furthering the art, and are to be construed as being without limitation to such specifically recited examples and conditions. Moreover, all statements herein reciting principles, aspects, and embodiments, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the subject matter has been described in terms of exemplary embodiments, it is not limited thereto. Rather, the appended claims should be construed broadly, to include other variants and embodiments, which may be made by those skilled in the art without departing from the scope and range of equivalents of the disclosure.

What is claimed is:

1. An integrated circuit, comprising:
a layer of a semiconductor device including a standard cell configuration having a fixed gate electrode pitch between adjacent gate electrode lines; and
a resistor formed of metal between adjacent gate electrode lines of the standard cell configuration;
wherein the integrated circuit is a charged device model (CDM) electrostatic discharge (ESD) protection circuit in a cross power domain, the CDM ESD protection circuit including adjacent standard cells abutting each other.

2. The integrated circuit of claim 1, wherein the CDM ESD protection circuit comprises the resistor and a gate grounded NMOS (ggNMOS) circuit.

3. The integrated circuit of claim 1, wherein the CDM ESD protection circuit is coupled between a first inverter circuit of a first domain and a second inverter of a second domain.

4. The integrated circuit of claim 1, wherein the resistor has a value of 200 Ohms.

5. The integrated circuit of claim 1, wherein the resistor has a value of 100 Ohms.

6. The integrated circuit of claim 1, wherein the resistor has a value of 50 Ohms.

7. The integrated circuit of claim 1, wherein the metal used for the resistor is an electrostatic dissipating resistor primarily made from tungsten and the gate electrode lines are disposed over a High-K gate dielectric material.

8. A charged device model (CDM) electrostatic discharge (ESD) protection circuit for a cross domain standard cell, comprising:
a gate grounded NMOS device; and
a resistor coupled to the gate grounded NMOS device, the resistor formed of one or more layers of metal between adjacent polysilicon lines of a standard cell configuration containing the gate grounded NMOS device and the resistor.

9. The CDM ESD protection circuit of claim 8, wherein the CDM ESD protection circuit is arranged and constructed without a keep out zone between adjacent cells of the standard cell configuration.

10. The CDM ESD protection circuit of claim 8, wherein said adjacent polysilicon lines are disposed over an insulating layer used as a gate insulating layer for transistors formed on a substrate upon which the CDM ESD protection circuit is disposed.

11. The CDM ESD protection circuit of claim 8, wherein said resistor is formed of two layers of metal and further comprising a third layer of metal that forms a connection between an input port of the CDM ESD protection circuit and an output port of the CDM ESD protection circuit.

12. The CDM ESD protection circuit of claim 8, wherein the metal of the one or more layers of metal is primarily made from tungsten.

13. The CDM ESD protection circuit of claim 8, wherein the resistor is coupled to the drain of the gate grounded NMOS device.

14. An integrated circuit comprising:
a plurality of gate electrode lines separated by a fixed gate electrode pitch to form a core standard cell device;
a first layer of metal disposed laterally between and at the same level as adjacent gate electrode lines of said plurality of gate electrode lines, said first layer of metal forming a portion of a resistor; and
at least a second layer of metal coupled to the first layer of metal and forming another portion of the resistor,
wherein the core standard cell device and the resistor form a charged device model (CDM) electrostatic discharge (ESD) protection circuit in a cross power domain and the gate electrode lines are formed of a semiconductor material.

15. The integrated circuit of claim 14, wherein the core standard cell device comprises a gate grounded NMOS device and the semiconductor material comprises polysilicon.

16. The integrated circuit of claim 14, further comprising a third layer of metal connecting the resistor to the gate grounded NMOS device and further connecting the resistor to a circuit from a second power domain.

17. The integrated circuit of claim 14, wherein the CDM ESD protection circuit is arranged and constructed with adjacent cells of the core standard cell device abutting each other.

18. The integrated circuit of claim 14, wherein the resistor includes a further portion directly on one of the gate electrode lines.

19. An integrated circuit comprising:
a layer of a semiconductor device including a standard cell configuration having a fixed gate electrode pitch between adjacent gate electrode lines; and
a resistor formed of metal between adjacent gate electrode lines of the standard cell configuration;
wherein the integrated circuit is a charged device model (CDM) electrostatic discharge (ESD) protection circuit in a cross power domain, and the CDM ESD protection circuit is coupled between a first inverter circuit of a first domain and a second inverter of a second domain.

20. An integrated circuit comprising:
a layer of a semiconductor device including a standard cell configuration having a fixed gate electrode pitch between adjacent gate electrode lines; and
a resistor formed of metal between adjacent gate electrode lines of the standard cell configuration;
wherein the metal used for the resistor is an electrostatic dissipating resistor primarily made from tungsten and the gate electrode lines are disposed over a High-K gate dielectric material.

* * * * *